US006563226B2

(12) United States Patent
Harun et al.

(10) Patent No.: US 6,563,226 B2
(45) Date of Patent: May 13, 2003

(54) BONDING PAD

(75) Inventors: Fuaida Bte Harun, Selangor (MY); Lan Chu Tan, Selangor (MY)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/864,098

(22) Filed: May 23, 2001

(65) Prior Publication Data
US 2002/0175411 A1 Nov. 28, 2002

(51) Int. Cl.[7] .......................... H01L 23/48; H01L 23/52; H01L 29/40
(52) U.S. Cl. ........................................ 257/784; 257/786
(58) Field of Search ................................ 257/784, 786, 257/690

(56) References Cited

U.S. PATENT DOCUMENTS

| 5,401,689 | A | 3/1995 | Frei et al. | 437/209 |
| 5,441,917 | A | 8/1995 | Rostoker et al. | 437/195 |
| 5,544,804 | A | 8/1996 | Test et al. | 228/180.5 |
| 5,565,385 | A | 10/1996 | Rostoker et al. | 437/209 |
| 5,594,273 | A | 1/1997 | Dasse et al. | 257/620 |
| 5,635,424 | A | 6/1997 | Rostoker et al. | 438/612 |
| 5,693,565 | A | 12/1997 | Camilletti et al. | 437/192 |
| 5,786,701 | A | 7/1998 | Pedder | 324/754 |
| 5,891,745 | A | 4/1999 | Dunaway et al. | 438/18 |
| 6,143,668 | A | 11/2000 | Dass et al. | 438/763 |
| 6,166,556 | A | 12/2000 | Wang et al. | 324/765 |
| 6,180,964 | B1 | 1/2001 | Yiu et al. | 257/121 |
| 6,181,016 | B1 | 1/2001 | Lin et al. | 257/786 |
| 6,359,342 | B1 * | 3/2002 | Yuan et al. | 257/784 |
| 2002/0003309 | A1 * | 1/2002 | Sasaki | 257/780 |
| 2002/0017729 | A1 * | 2/2002 | Macpherson | 257/784 |

* cited by examiner

Primary Examiner—Phat X. Cao
(74) Attorney, Agent, or Firm—Charles Bergere

(57) ABSTRACT

A wire bonding pad of a semiconductor integrated circuit device includes a first, test portion to which a probe tip may be contacted, and a second, wire bonding portion to which a wire is bonded for electrically connecting the bonding pad to a carrier or lead frame. Providing a separate, test portion prevents the wire bonding portion from being damaged by a probe tip during testing.

11 Claims, 2 Drawing Sheets

BONDING PAD

BACKGROUND OF THE INVENTION

1. Field of the Invention

The present invention relates to integrated circuits and, more particularly to a bonding pad that allows for more reliable wire bonding.

2. Background of Related Art

An integrated circuit (IC) die is a small device formed on a semiconductor wafer, such as a silicon wafer. Such a die is typically cut from the wafer and then pads on the die are electrically connected to leads of a carrier or lead frame via wire bonding. The die and wire bonds are encapsulated with a protective material such that a package is formed. The leads of the lead frame protrude from the package and terminate in pins that allow the die to be electrically connected with other circuits, such as on a printed circuit board.

While the complexity of integrated circuits has been increasing, the size of such circuits has been decreasing. Further, more pads are required in a smaller area, causing the size of the pads and the space between pads to decrease. FIGS. 1A and 1B illustrate the decrease in pad size and spacing. The measurement from the center of a pad to the center of an adjacent pad is referred to as pitch. FIG. 1A is an enlarged view of a die 10 having bonding pads 12 with a 90 um pitch and FIG. 1B is an enlarged view of a die 14 having bonding pads 16 with a 50 um pitch.

Before a die is cut from the wafer on which it is formed, the die is tested by placing probes in contact with the bond pads. The probes cause marks on the bond pads. Although the size of the bond pads has decreased, probe technology has lagged behind the wire-bonding technology. That is, as the pad dimension has decreased, the size of the probe tips used for testing has remained about the same, making the pads more susceptible to being damaged by the probes. As is understood by those of skill in the art, ultra fine pitch bonding quality and reliability are affected by probe mark area and depth, and the frequency with which the pads have been probed.

FIG. 2A is an enlarged top plan view of a pair of adjacent die bonding pads 20 having probe marks 22 caused by probe tips and FIG. 2B is an enlarged view of pads 24, 26 that have been damaged by probe tips. More specifically, the metallization of the pad 24 has been punctured and the pad 26 has been cracked. Over sized probes can also form ball bonds at the probe mark area that may impede intermetallic growth.

Referring now to FIG. 3, a conventional bonding pad 30 is shown. The bonding pad 30 is formed of metal such as copper, aluminum and gold. The bonding pad 30 includes a border 32 that surrounds a perimeter of the pad 30. The border 32 is generally formed of a metal layer coated with polymide. The bonding pad 30 has a width X and a length Y. For a device having a 63 um pitch, X is about 60 um, Y is about 90 um, the border 32 is about 2 um wide, and the space between adjacent pads is about 3 um.

The inner area of the pad 30 is used to attach a connection wire (not shown) to the pad 30 using a wire bonding technique. Wire bonding is typically done using one of three industry standard techniques: thermocompression (T/C) bonding, which uses a combination of pressure and elevated temperature; thermosonic (T/S) bonding, which uses a combination of pressure, elevated temperature and ultrasonic vibration bursts; and ultrasonic (U/S) bonding, which uses a combination of pressure and ultrasonic vibration bursts.

A circular shaded area denoted 34 represents the effective diameter of a bonded ball, which is the dimension of the ball that actually contacts the pad 30. For a 63 um pitch, the required bonded ball diameter (BBD) is about 40–45 um. The inner, oval shaded area denoted 36 represents a probe mark. As previously discussed, probe marks can damage pads, causing poor quality or unreliable wire bonds.

It is an object of the present invention to provide a bonding pad that allows for more reliable wire bonding.

SUMMARY OF THE INVENTION

In order to provide more reliable wire bonds, the present invention provides an integrated circuit device bonding pad having a first area for receiving a probe tip and a second area to which a connection wire may be bonded. The first area and second area are preferably separated by a partition formed of metal.

The present invention also provides an integrated circuit device bonding pad having a first area for receiving one of a probe tip and a connection wire, and a second area continuous with the first area, the second area for receiving the other one of the probe tip and the connection wire.

The present invention further provides an improved integrated circuit bonding pad having a metal partitioning line extending from a first side of the pad to a second, opposite side of the bonding pad, the partitioning line forming a pad first area and a separate, pad second area, wherein the pad first area is for receiving a probe tip and the pad second area is for receiving one end of a bonding wire for connecting the pad to a lead frame.

In another embodiment, the present invention provides a method of testing an integrated circuit die, the die having a plurality of bonding pads, including the steps of placing a probe tip on a first area of at least one of the die bonding pads, testing the die via a test device connected to the die via the probe tip, removing the probe tip from the at least one die bonding pad upon completion of the testing step, and attaching a wire to a second area of the at least one of the die bonding pads. The second area is separate from the first area. Partitioning also provides good contrast and thus enhances the Pattern Recognition system (PRS) for the wire bonder for better bonding placement. Bonding placement is critical for Ultra Fine Pitch applications with the standard requirement that 100% of the bonded ball diameter must be within the bonding pad dimensions.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there is shown in the drawings embodiments that are presently preferred. It should be understood, however, that the invention is not limited to the precise arrangements and instrumentalities shown. In the drawings.

DETAILED DESCRIPTION OF PREFERRED EMBODIMENTS

Figure 1A:
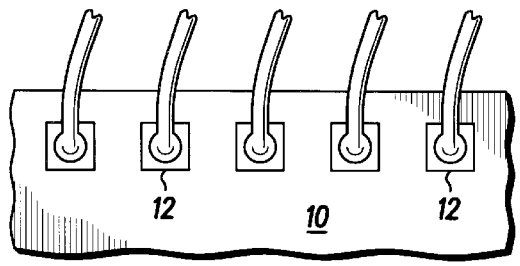
FIG. 1A is an enlarged top plan view of a portion of a conventional die having bonding pads with a 90 um pitch.
Figure 1B:
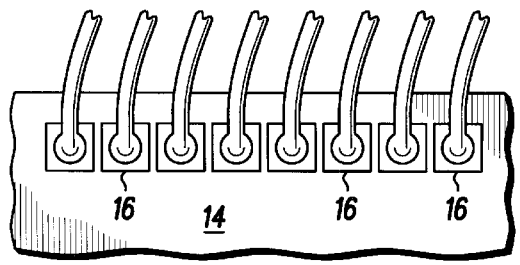
FIG. 1B is an enlarged top plan view of a portion of a conventional die having bonding pads with a 50 um pitch.
Figure 2A:
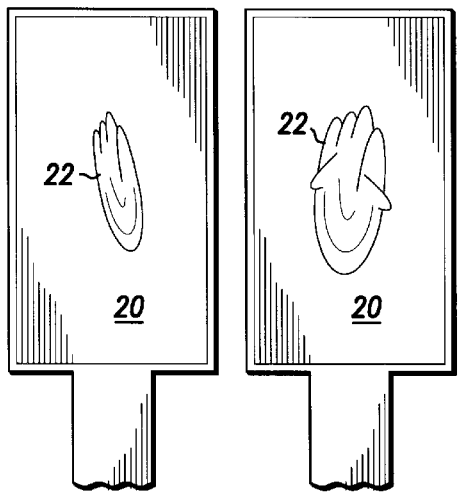
FIG. 2A is an enlarged top plan view of a conventional wire bonding pad having probe marks.
Figure 2B:
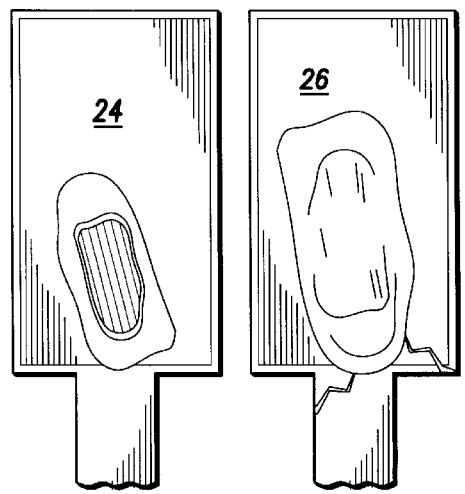
FIG. 2B is an enlarged top plan view of a conventional wire bonding pad that has been damaged by probing.
Figure 3:
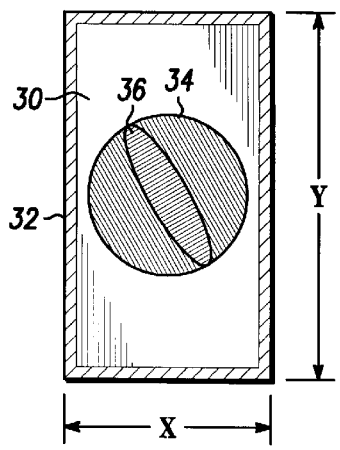
FIG. 3 is an enlarged top plan view of a conventional die pad showing a ball bond area and a probe mark.

The detailed description set forth below in connection with the appended drawings is intended as a description of the presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout.

As previously discussed, the decreasing size of bonding pads has made the bonding pads more susceptible to damage caused by probing. This problem is especially apparent in ultra-fine pitch pads. Since the probe mark area, depth and frequency of probing have a large impact on ultra fine pitch bonding quality and reliability, it has been determined that to ensure good bondability, the size of the probe mark should be less than about 30% of BBD or about 16% of the pad opening. Unfortunately, using current probing technology, the size of the probe mark is often greater than the desired 16% of pad opening.

One solution is to elongate the pad dimension, effectively doubling the size of the pad, which allows the bonding to be performed away from the probe mark. However, this solution requires a lot of extra space, which is generally not readily available.

Figure 4:
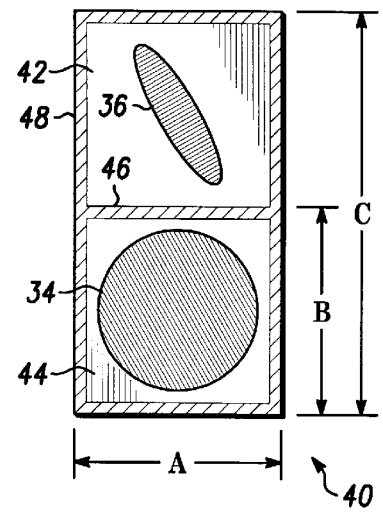
FIG. 4 is an enlarged top plan view of a die pad showing a ball bond area and a probe mark in accordance with a first embodiment of the present invention.

Referring now to FIG. 4, a bonding pad 40 of an integrated circuit device in accordance with a first embodiment of the present invention is shown. In the bonding pad 40, separate spaces are provided for probing and bonding. The pad 40 includes a first area 42 and a second area 44 adjacent to the first area 42. A partition 46 separates the first area 42 from the second area 44 and a border 48 extending around the outer perimeter of the first and second areas 42, 44. The partition 46 connects a first side of the border 48 with a second, opposing side of the border 48.

The pad 40 is sized and shaped so that the first area 42 can receive one of a probe tip and a connection wire or other connector such as a ball and the second area can receive the other one of the probe tip and the connection wire. In the drawing, the first area 42 shows a probe tip mark 36 and the second area shows a diameter of a bonded ball 34.

Figure 5:
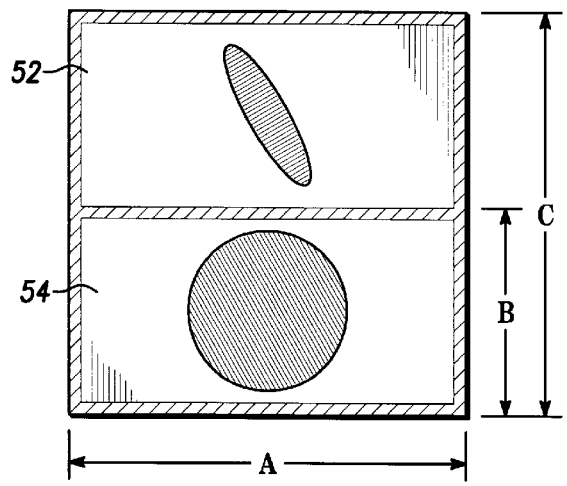
FIG. 5 is an enlarged top plan view of a die pad showing a ball bond area and a probe mark in accordance with a second embodiment of the present invention.

The width of the pad 40 is shown as A and the length of the pad is shown as C. The width A is preferably the minimum pad width for a given pitch. Preferably, the length C is greater than or equal to about 2A to cater to probe capability. The partition 46 is positioned such that the first area 42 and the second area 44 have substantially equal areas. Thus, in a preferred embodiment, while the pad 40 has an overall rectangular shape, each of the first area 42 and the second area 44 are substantially square, such that the width A is equal to a height B of the second area 44. However, as will be understood by those of ordinary skill in the art, the first and second areas 42, 44 need not be square shaped. For example, FIG. 5 shows an alternative shape for a pad 50 in which the width A and the length C are substantially the same, such that the first and second areas 52, 54 are rectangular in shape. A length B of the second area 54 is about one-half of the length C. A pad shaped like the pad 50 is preferably used at a corner of a die. Partitioning provides good contrast and thus enhances the Pattern Recognition system (PRS) for the wire bonder for better bonding placement. Bonding placement is critical for Ultra Fine Pitch applications, which require that 100% of the bonded ball diameter must be within the bonding pad dimensions.

Figure 6:
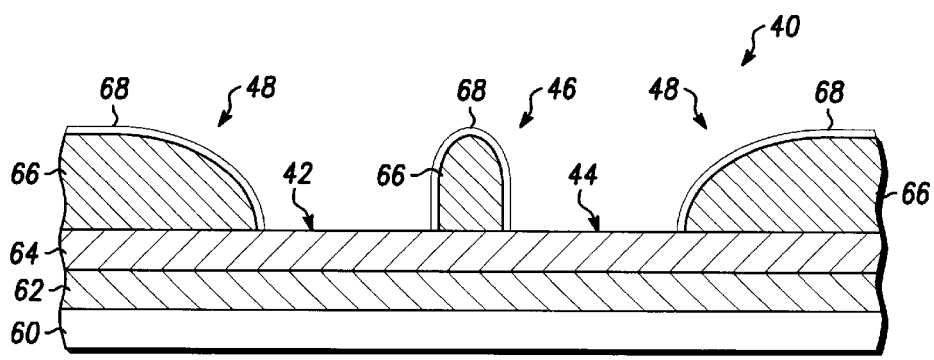
FIG. 6 is an enlarged cross-sectional view of the die pad of FIG. 4.

Referring now to FIG. 6, an enlarged cross-sectional view of the pad 40 is shown. The first area 42 and the second area 44 may be formed as a series of layers including an oxide layer 60, a titanium nitride layer 62 or any other means of barrier metal which is understood by those of skill in the art, and a top layer 64 preferably formed of at least one of aluminum, copper and silicon, as is understood by those of skill in the art. During fabrication, the first area 42 and the second area 44 are one continuous area and the partition 46 and the border 48 are formed over the continuous area. The partition 46 and the border 48 are preferably formed of a metal 66 coated with polymide 68. The metal 66 and the polymide 68 may be coated on the top layer 64 and then etched to expose the first and second areas 42, 44, as will be understood by those of skill in the art.

Referring again to FIG. 4, the border 48 has a width of about 2 um to about 30 um. Preferably, the width of the partition 46 is closer to 2 um. The partition 46 acts as a separator between the first and second areas 42, 44 so that the area used for bonding appears as a single entity or single pad area, which facilitates the bond targeting process. That is, presenting the first and second areas 42, 44 as separate spaces facilitates the operation of the wire bond Pattern Recognition System (PRS). Thus, the partition could be less than 2 um wide depending upon fabrication ability and the ability of the PRS to detect and distinguish between the first and second areas 42, 44.

As previously discussed, the pad 40 is useful because it prevents a wire bond area from being damaged by a probe tip by providing separate areas on a single pad for probing and wire bonding. By providing a separate space for wire bonding, the wire bonding space allows for good bondability for thermosonic bonding (ball bonding). No additonal wire is bonded on the other portion of the pad area.

The present invention also provides a method of testing an integrated circuit die that includes a plurality of bonding pads, each or some of the pads having first and second areas. That is, it is not required that all of the pads of a die include the partition 46. For example, certain pads could be designated for probing or testing and other pads may not be required to be contacted by a probe tip for testing.

In testing a die having pads as described above, a probe tip is placed on the first area 42 of at least one of the die bonding pads 40. The die is then tested using a known test device connected to the die via the probe tip. When a specific test or all of the testing is completed, the probe tip is removed from the at least one die bonding pad 40. Next, wire bonding is performed by attaching a wire to the second area 44 of the at least one of the die bonding pads 40. As previously discussed, the present invention is not limited to any particular wire bonding technique.

As is apparent, the present invention provides a new pad geometry that allows probe tips to contact an area of a pad separate from the area of the pad used for wire bonding so that the wiring bonding area will not be damaged by a probe tip and thus, wire bonding yields more reliable bonds.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. For example, the present invention is not limited to any single wire bonding technique. Further, although the invention is described in conjunction with wire bonding connection technology, the invention may be practiced with other connection techniques, such as direct chip attach. It is understood, therefore, that this invention is not limited to the particular embodiments disclosed, but covers modifications within the spirit and scope of the present invention as defined by the appended claims.

What is claimed is:

1. An integrated circuit device bonding pad, comprising:
   a first area for receiving one of a probe tip and a connection wire;
   a second area adjacent to the first area, the second area for receiving the other one of the probe tip and the connection wire; a border extending around the outer perimeter of the first and second areas; and
   a partition connecting a first side of the border with a second opposing side of the border and separating the first area from the second area, wherein the partition is formed of a metal.

2. The bonding pad of claim 1, wherein the first area and the second area have substantially equal areas.

3. The bonding pad of claim 2, wherein the first area and the second area are substantially square.

4. The bonding pad of claim 1, wherein the border is formed of a metal.

5. The bonding pad of claim 4, wherein the metal of the partition and the border are coated with polymide.

6. The bonding pad of claim 5, wherein the first area and the second area are formed of at least one of aluminum, copper and silicon.

7. The bonding pad of claim 1, wherein the bonding pad has a length that is greater than or equal to about twice a width of the pad.

8. An improved semiconductor integrated circuit bonding pad having a border therearound, said bonding pad comprising:
   a metal partitioning line extending from the border on a first side of the pad to the border on a second, opposite side of the bonding pad, the partitioning line forming a pad first area and a separate, pad second area, wherein the pad first area is for receiving a probe tip and the pad second area is for receiving one end of a bonding wire for connecting the pad to a lead frame.

9. The bonding pad of claim 8, wherein the bonding pad has a length that is greater than or equal to about twice a width of the pad.

10. An integrated circuit device bonding pad, comprising:
    a first area for receiving one of a probe tip and a connection wire;
    a second area contiguous with the first area, the second area for receiving the other one of the probe tip and the connection wire;
    a metal border formed around an outer perimeter of the bonding pad; and
    a metal partition connecting a first side of the border and a second opposing side of the border, the border and the partition defining the area of the first and second areas.

11. The bonding pad of claim 10, wherein the bonding pad has a length that is greater than or equal to about twice a width of the pad.

* * * * *